(12) United States Patent
Hynecek (10) Patent No.: US 7,700,950 B2
(45) Date of Patent: Apr. 20, 2010

(54) IMAGE SENSOR WITH COMPACT PIXEL LAYOUT

(76) Inventor: Jaroslav Hynecek, 905 Pampa Dr., Allen, TX (US) 75013

( * ) Notice: Subject to any disclaimer, the term of this patent is extended or adjusted under 35 U.S.C. 154(b) by 956 days.

(21) Appl. No.: 11/260,010

(22) Filed: Oct. 26, 2005

(65) Prior Publication Data

US 2006/0284177 A1 Dec. 21, 2006

(30) Foreign Application Priority Data

Jun. 15, 2005 (KR) .................. 10-2005-0051555

(51) Int. Cl.
*H01L 29/04* (2006.01)
*H01L 29/10* (2006.01)
*H01L 31/00* (2006.01)
(52) U.S. Cl. ..................................... 257/59
(58) Field of Classification Search ......... 257/252–254, 257/81, 82, 91, 98, 99, 100, 116, 117, 432–437, 257/749, 292, 294, 291, 57, 53, 797, 587, 257/588, 239, 222, 258, 290, 233, 231, 232; 438/22, 24, 48, 65, 66, 67; 348/308, E3.018, 348/320, 322, 294, 300–302; 250/208.1, 250/214 DC, 214.1, 214 R
See application file for complete search history.

(56) References Cited

U.S. PATENT DOCUMENTS

| 6,027,955 | A | 2/2000 | Lee et al. | |
|---|---|---|---|---|
| 6,107,655 | A * | 8/2000 | Guidash | 257/233 |
| 6,291,810 | B1 | 9/2001 | Yokomichi et al. | |
| 6,352,869 | B1 | 3/2002 | Guidash | |
| 6,407,440 | B1 * | 6/2002 | Rhodes | 257/462 |
| 6,423,994 | B1 | 7/2002 | Guidash | |
| 6,466,266 | B1 | 10/2002 | Guidash et al. | |
| 6,657,665 | B1 * | 12/2003 | Guidash | 348/308 |
| 6,730,899 | B1 | 5/2004 | Stevens et al. | |
| 6,835,590 | B2 | 12/2004 | Lee | |
| 6,982,186 | B2 | 1/2006 | Jeon et al. | |
| 7,193,258 | B2 * | 3/2007 | Hara et al. | 257/291 |
| 2006/0118837 | A1 * | 6/2006 | Choi | 257/292 |

FOREIGN PATENT DOCUMENTS

| CN | 1437263 | 8/2003 |
|---|---|---|
| CN | 1507743 | 6/2004 |

(Continued)

OTHER PUBLICATIONS

Taiwanese Search Report issued in counterpart Taiwanese Application No. 094138646, mailed Apr. 23, 2008.

(Continued)

*Primary Examiner*—Dao H Nguyen
*Assistant Examiner*—Tram H Nguyen
(74) *Attorney, Agent, or Firm*—McAndrews, Held & Malloy, Ltd.

(57) ABSTRACT

Solid-state image sensors, specifically the image sensor pixels, which have three or four transistors, high sensitivity, low noise, and low dark current, are provided. The pixels have separate active regions for active components, row-shared photodiodes and may also contain a capacitor to adjust the sensitivity, signal-to-noise ratio and dynamic range. The low dark current is achieved by using pinned photodiodes.

29 Claims, 7 Drawing Sheets

FOREIGN PATENT DOCUMENTS

| | | |
|---|---|---|
| CN | ZL 200510126047.3 | 5/2009 |
| EP | 0926738 | 12/1998 |
| JP | 11-126895 | 11/1999 |
| JP | 11-312822 | 11/1999 |
| JP | 2003-282855 | 10/2003 |
| JP | 2005-101490 | 4/2005 |
| KR | 10-2005-0051555 | 5/2005 |
| TW | 398078 | 7/2000 |
| TW | 486816 | 5/2002 |
| TW | 488034 | 5/2002 |
| TW | 200414525 | 8/2004 |

OTHER PUBLICATIONS

English language translation of Taiwanese Search Report issued in counterpart Taiwanese Application No. 094138646, mailed Apr. 23, 2008.

English language abstract of JP 11-312822, published Nov. 9, 1999.

English language abstact of JP 2003-282855, published Oct. 3, 2003.

English language abstract of JP 2005-101490, published Apr. 14, 2005.

English language abstract of TW 398078, published Jul. 11, 2000.

English language abstract of TW 486816, published May 11, 2002.

English language abstract of TW 488034, published May 21, 2002.

English language abstract of TW 200414525, published Aug. 1, 2004.

* cited by examiner

IMAGE SENSOR WITH COMPACT PIXEL LAYOUT

FIELD OF THE INVENTION

The present invention relates to a solid-state image sensor; and, more particularly, to a complementary metal-oxide semiconductor (CMOS) image sensor, which has four or three transistor pixels (4T, 3T), compact layout, high sensitivity, and low dark current. The low dark current is achieved by quenching the interface states by placing a p+ implant near the silicon-silicon dioxide interface.

DESCRIPTION OF RELATED ARTS

A typical image sensor senses light by converting impinging photons into electrons that are integrated (collected) in sensor pixels. After completion of the integration cycle, charge is converted into a voltage, which is supplied to output terminals of the sensor. In CMOS image sensors the charge-to-voltage conversion is accomplished directly in the pixels themselves and the analog pixel voltage is transferred to the output terminals through various pixel addressing and scanning schemes. The analog signal can be also converted on-chip to a digital equivalent before reaching the chip output. The pixels have incorporated in them a buffer amplifier, typically the source follower, which drives the sense lines that are connected to the pixels by suitable addressing transistors.

After charge-to-voltage conversion is completed and the resulting signal transferred out from the pixels, the pixels are reset in order to be ready for accumulation of new charge. In pixels employing a floating diffusion (FD) node as a charge detection node, the reset is accomplished by turning on a reset transistor that momentarily conductively connects the FD node to a voltage reference. This step removes the collected charge; however, it generates the well-known kTC-reset noise. The kTC noise has to be removed from the signal by a correlated double sampling (CDS) signal processing technique in order to achieve a desired low noise performance. The typical CMOS sensors that utilize the CDS concept need to have four transistors (4T) in the pixel.

Examples of the 4T pixel circuit can be found in the U.S. Pat. Nos. 6,107,655, 6,352,869 and 6,657,665 issued to Guidash. By introducing switching pulses into the Vdd bias line, it is possible to eliminate the select transistor from the pixel and achieve the CDS operation with only 3T in the pixel as described by Masahiro Kasano in an article entitled "A 2.0 μm Pixel Pitch MOS Image Sensor with an Amorphous Si Film Color Filter." *Digest of Technical Papers ISCC*, vol. 48, February 2005, pp. 348-349.

Figure 1:
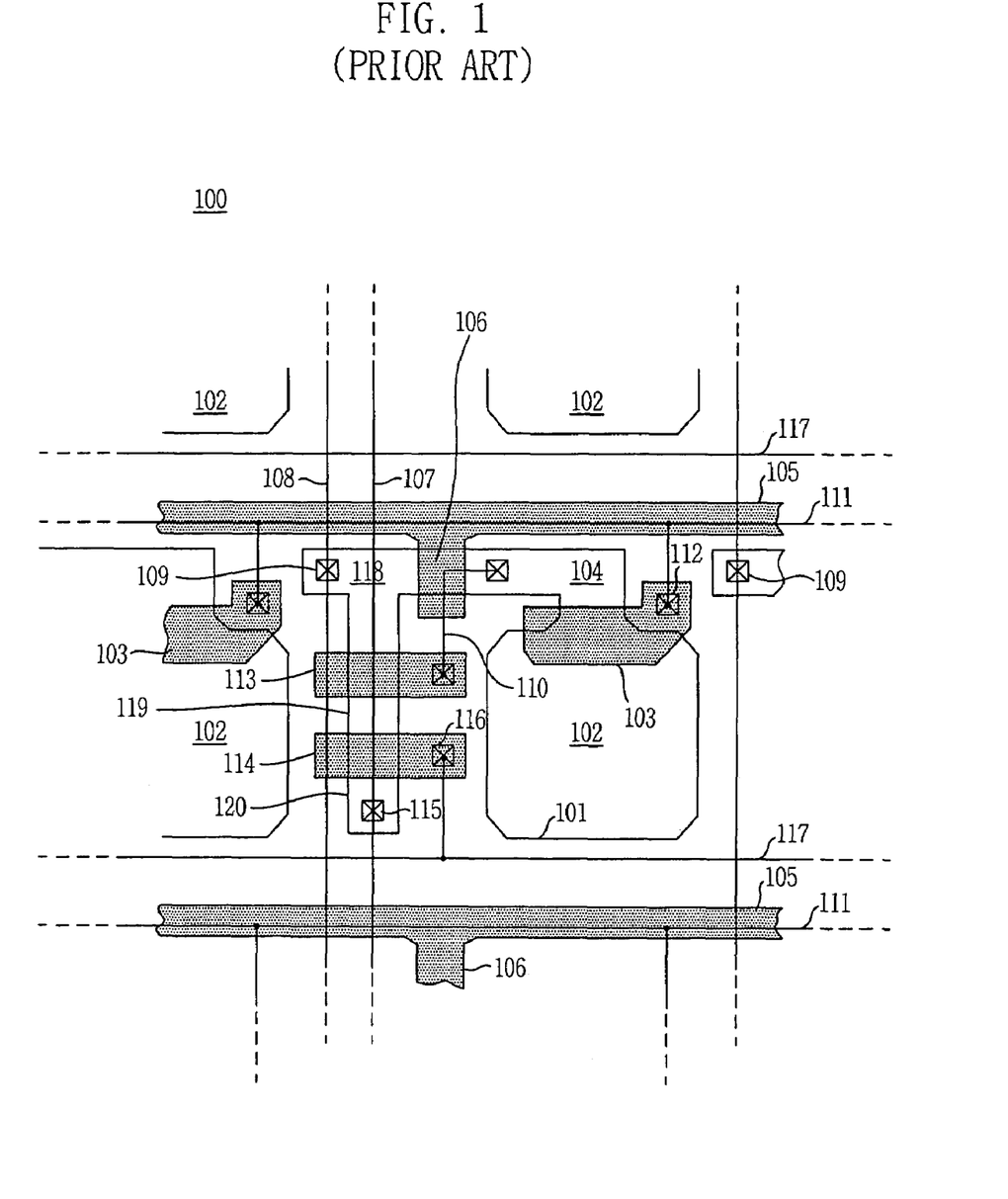
FIG. 1 shows a simplified layout of a conventional 4T image sensor pixel that has a common active region with a pinned photodiode and transistors.

FIG. 1 is a simplified layout of a conventional 4T image sensor pixel that has a common active region with a pinned photodiode and transistors In FIG. 1, a reference numeral 100 represents the simplified layout diagram of the conventional 4T pixel used in typical CMOS image sensors. Many such pixels are arranged in an array forming rows and columns in the actual image sensor, but for the simplicity of the drawing only one is shown in a greater detail. An active region 101 contains active elements of the pixel; those are, a pinned photodiode 102, a transfer gate 103, a floating diffusion (FD) node 104, a reset gate 106, a drain bias node 118, a drive transistor gate 113 serving as a source follower (SF), a source-drain region 119, an address select transistor gate 114, and an address select transistor source 120.

The area outside of the enclosed active region 101 is a shallow trench isolation (STI) region that is filled with thick isolation silicon dioxide. Also, in FIG. 1, the multilevel metal interconnects present in the pixel have been for clarity of the drawing omitted and replaced schematically by lines. A fist horizontal line 117 is a row address line connected to a first contact 116 of the address select transistor gate 114, a second horizontal line 111 is a row transfer line connected to a second contact 112 of the transfer gate 103, and a poly-silicon bus 105 supplies a row reset signal to the reset gate 106 of the pixel. A first column line 108 provides the Vdd bias via third contact 109 to the drain bias node 118, while a second column line 107 carries the output signal from the address select transistor source 120 via fourth contact 115 to the column signal processing circuits located at the periphery of the array. The FD node 104 is connected to the drive transistor gate 113 via interconnect 110. The addressing and reset signals are supplied to the pixels also from the periphery of the array through the first horizontal line 117, the fourth contact 115 and the poly-silicon bus 105.

While this pixel functions well, this type of the pixel still has two main disadvantages: too many transistors occupy the large pixel area, and their position and interconnections cannot be efficiently arranged due to the contiguous shape of the active region 101. The larger number of transistors in each pixel may become a disadvantage when the pixel size needs to be reduced in order to build low cost and high-resolution image sensors.

For this reason, the above mentioned U.S. Pat. Nos. 6,107, 655, 6,352,869 and 6,657,665 teach a technology that the circuits for read operation with 4T commonly share the photodiodes of the adjacent pixels allocated at the different rows.

However, it may still be difficult to provide the conventional 4T image sensor pixel with the compact layout and, since the active region for configuring the photodiode has the contiguous shape with the transistor for reading the pixel signals, particularly, the active region of the reset transistor, it may be difficult to arrange the positions of the related pixel elements and interconnections with high efficiency.

SUMMARY OF THE INVENTION

It is, therefore, an object of the present invention to provide a practical CMOS image sensor that has high performance, simple structure and compact size.

In the embodiments with 4T or 3T pixels, it is possible to form a capacitor that is electrically connected between the common FD node and the drain of the drive transistor. This electric connection can be achieved through overlapping the polysilicon bus extended to the gate of the drive transistor with the drain of the drive transistor. Adjusting the amount of the overlap can vary the capacitance value of this capacitor. This feature is important for adjusting the conversion gain and thus the sensitivity of the sensor. The correct value of the capacitance also determines the dynamic range (DR) and the signal-to-noise ratio (SNR) of the sensor.

The embodiments utilize pixels with pinned photodiodes that have p+ Boron impurities implanted at the silicon-silicon dioxide interface in the pinned photodiode regions. This implantation causes quenching of the interface states and low dark current generation.

Furthermore, the drive transistor in the embodiments of the present invention can be fabricated as an N-channel metal-oxide-semiconductor (NMOS) transistor or as a P-channel MOS (PMOS) transistor. In particular, fabricating the drive transistor as a depletion type PMOS transistor contributes to an improvement of noise.

In accordance with an aspect of the present invention, there is provided an image sensor including a plurality of pixels arrayed in rows and columns, including: a first active region including two photodiodes each assigned for a different row and a common floating diffusion node shared by the two photodiodes; a second active region spatially separated from the first active region and including a reset transistor for resetting the corresponding pixel; and a third active region spatially separated from the first active region and the second active region and including a drive transistor outputting a pixel signal in response to a voltage on the floating diffusion node.

In accordance, with another aspect of the present invention, there is provided an image sensor including a plurality of pixels arrayed in rows and columns, including: a first active region including two photodiodes each assigned for a different row and a common floating diffusion node shared by the two photodiodes; a second active region spatially separated from the first active region and including a drive transistor outputting a pixel signal in response to a voltage from the floating diffusion node; a poly-silicon bus extended from a gate of the drive transistor; and a capacitor formed as the poly-silicon bus overlaps with a drain region of the drive transistor being a part of the second active region.

BRIEF DESCRIPTION OF THE DRAWINGS

The above and other objects and features of the present invention will become better understood with respect to the following description of the preferred embodiments given in conjunction with the accompanying drawings, in which:

FIGS. 3A to 3C show cross-sectional views taken along lines A-A', B-B', and C-C' of FIG. 3, respectively.

DETAILED DESCRIPTION OF THE INVENTION

CMOS image sensors with compact pixel layout in accordance with specific embodiments of the present invention will be described in detail with reference to the accompanying drawings.

Figure 2:
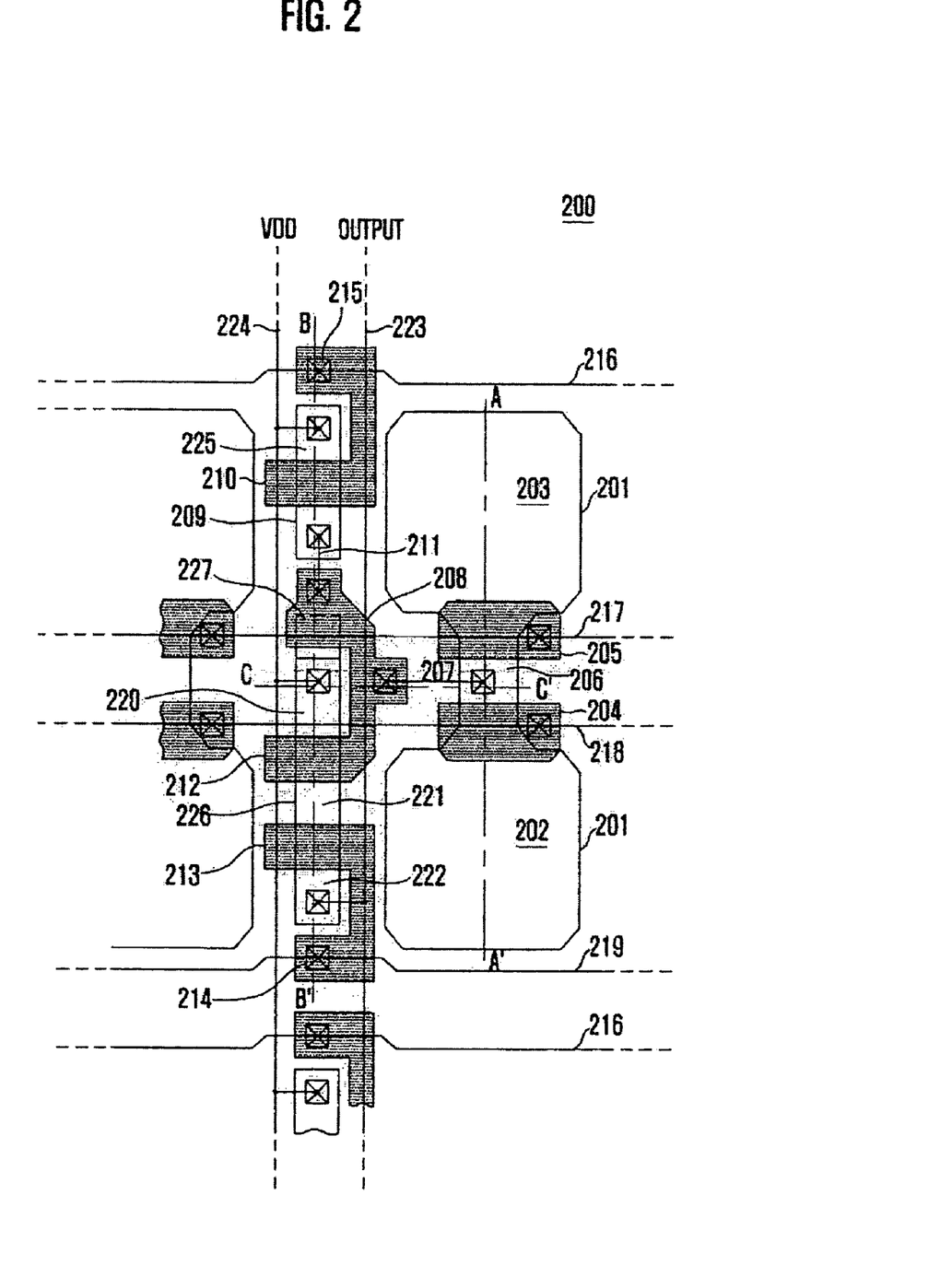
FIG. 2 shows a simplified layout of row-shared pixels including separate active regions for a reset transistor, a transfer transistor, a select transistor, a drive transistor, and a pinned photodiode in accordance with one embodiment of the present invention.

FIG. 2 represents a simplified layout of row-shared pixels that include separate active regions for a reset transistor, a transfer transistor, a select transistor, a drive transistor, and a pinned photodiode in accordance with one embodiment of the present invention.

As shown in FIG. 2, a pixel array 200 shows a pair of row pixel pinned photodiodes 202 and 203 that share the common circuits. The metal layers have been for simplicity omitted and replaced by schematically drawn interconnecting lines. The pixels are also arranged in an array forming many rows and many columns.

Figure 2A:
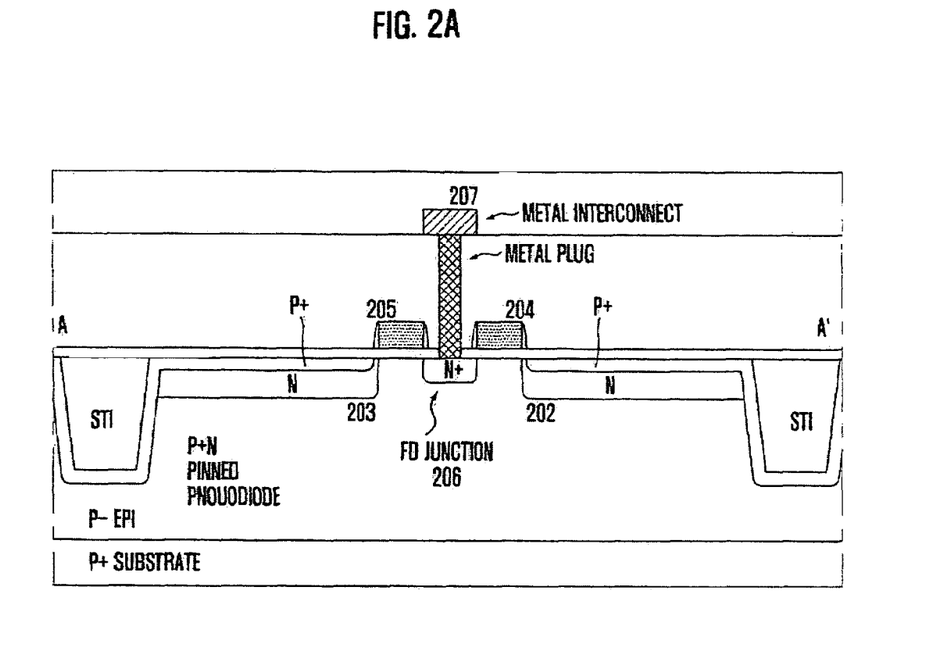
FIGS. 2A to 2C show cross-sectional views taken along lines A-A', B-B', and C-C', of FIG. 2, respectively.
Figure 2B:
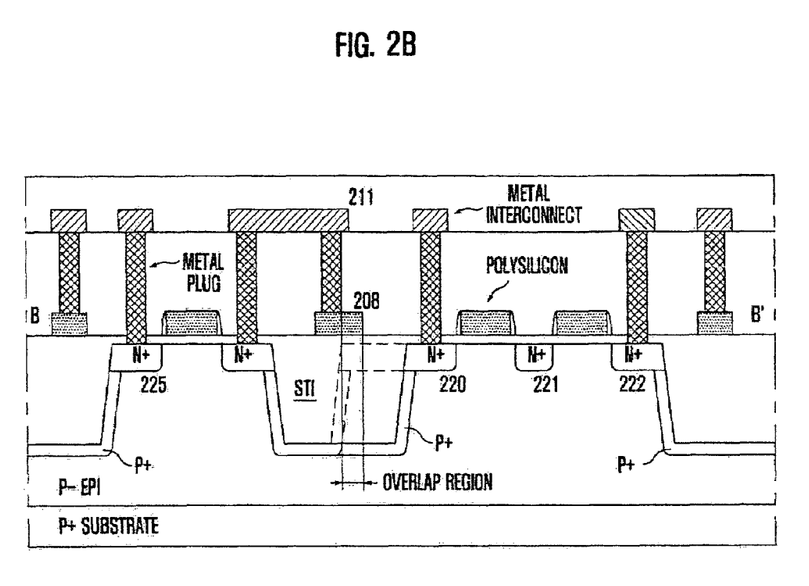
Figure 2C:
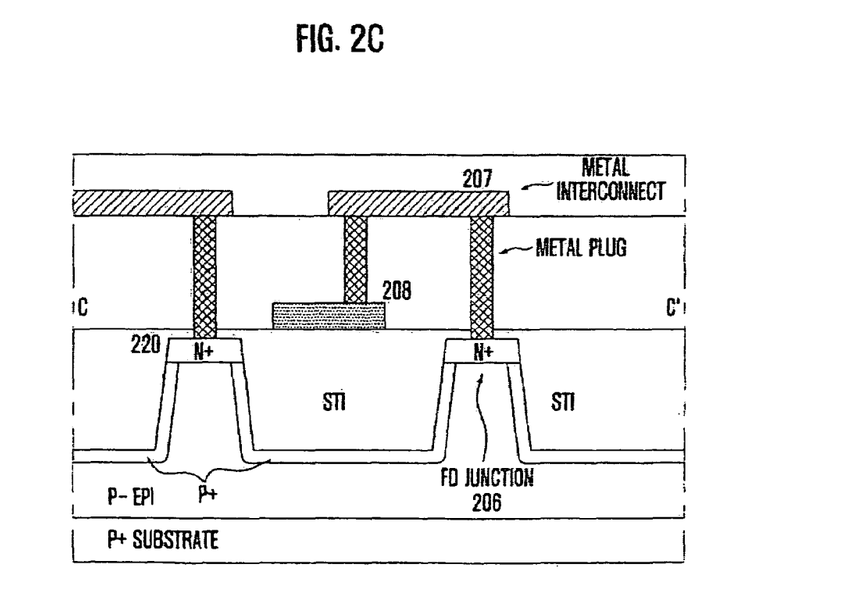

The specific feature of the row-shared pixels is the separation of the active region within the pixel into three distinct blocks. In particular, a first active block 201 contains the pair of pinned photodiodes 202 and 203. A second active block 209 contains a reset transistor, and a third active block 226 contains a drive transistor and an address select transistor. The first block 201 also contains transfer gates 204 and 205 and a common FD node 206 for detecting charge as also shown in FIG. 2A. A metal interconnect 207 connects the common FD node 206 to a poly-silicon bus 208 that is contiguous with a gate 212 of the drive transistor as also illustrated in FIG. 2B. An interconnect 211 connects the poly-silicon bus 208 also to a source of the reset transistor, which is formed by a gate 210 as also shown in FIG. 2C.

A reset signal is supplied to the reset gate 210 from a first horizontal bus line 216 via first contact 215. A drain 225 of the reset transistor is connected to a drain column bus line 224. Similarly, a drain 220 of the drive transistor is connected to the same drain column bus line 224. In particular, the drain column bus line 224 is a VDD signal line. A source 221 of the drive transistor is common with a drain of the address select transistor whose gate 213 receives an addressing signal from a second horizontal bus line 219 via second contact 214.

An output signal is sensed at a source 222 of the address select transistor, which is connected to another column bus line 223. In particular, said another column bus line 223 is a pixel output signal line.

Transfer gate bus lines 217 and 218 supply appropriate charge transfer signals generated in the circuits located at the periphery of the pixel array 200 to the transfer gates 205 and 204. Although not illustrated, the drain column bus line 224 and said another column bus line 223 are also connected to the circuits at the periphery of the pixel array 200 to supply the required bias and to process the output signal from the addressed pixel.

As can be seen from FIG. 2, the separation of the active region of the conventional 4T image sensor pixel into three distinct blocks and sharing the photodiodes in two rows with the same pixel signal sensing circuits result in a very efficient layout. The above described layout has higher aperture efficiency resulting in a higher performance sensor. By extending the third active region 226 under the poly-silicon bus 208 as indicated by a dashed line 227, it is possible to form a capacitor that is electrically connected between the common FD node, 206 and the drain 220, of the drive transistor. Adjusting the amount of the overlap between the third active region 226 and the poly-silicon bus 208 can vary the capacitance value of this capacitor. This feature is important for adjusting the conversion gain and thus the sensitivity of the sensor. The correct value of the capacitance also determines the dynamic range (DR) and the signal-to-noise ratio (SNR) of the sensor.

Figure 3:
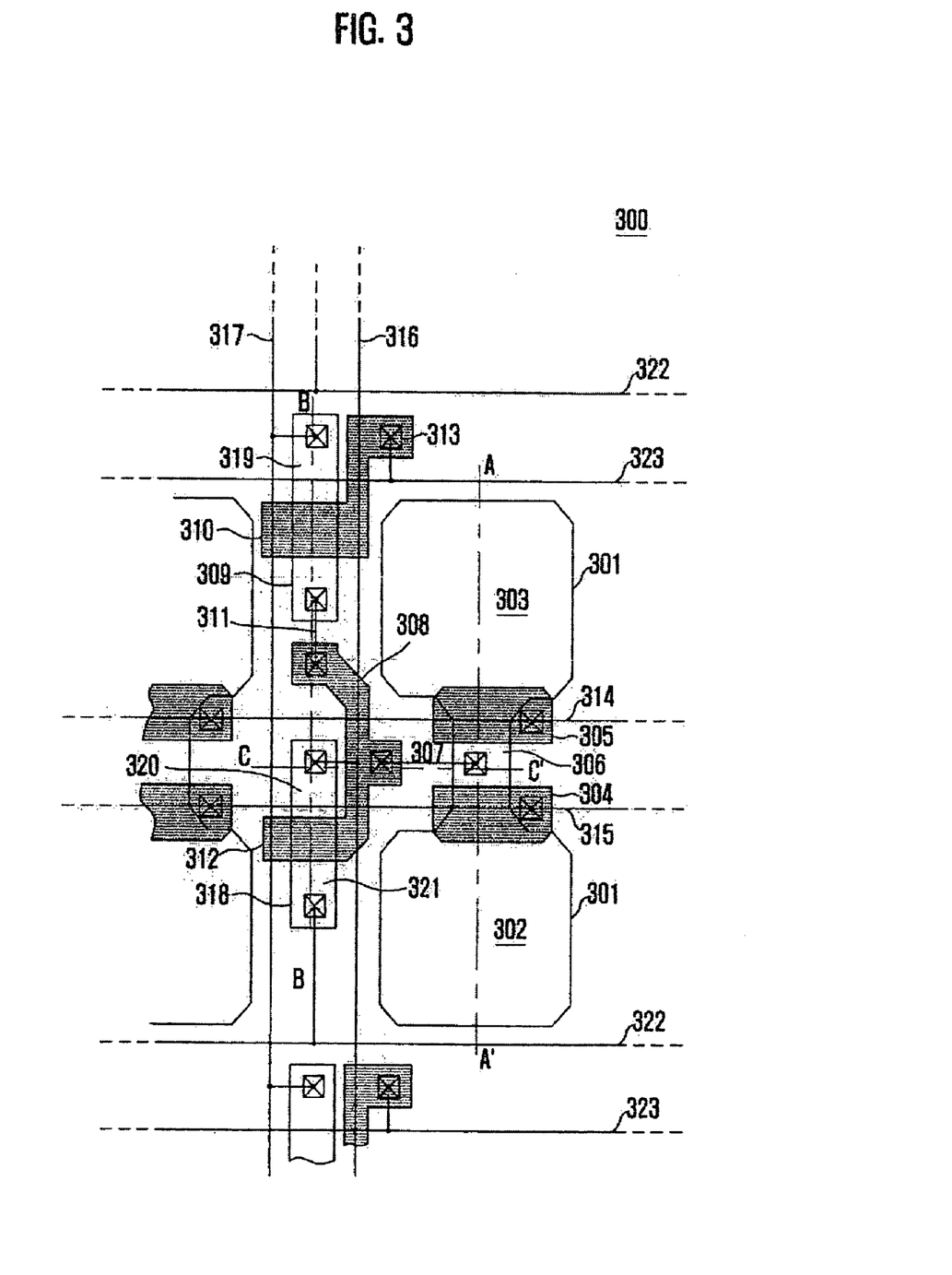
FIG. 3 shows a simplified layout of row-shared pixels where the select transistor is eliminated in accordance with another embodiment of the present invention.

Another embodiment of the invention is shown in FIG. 3. Particularly, FIG. 3 shows a simplified layout of another type of row-shared pixels where the select transistor is eliminated.

Figure 3B:
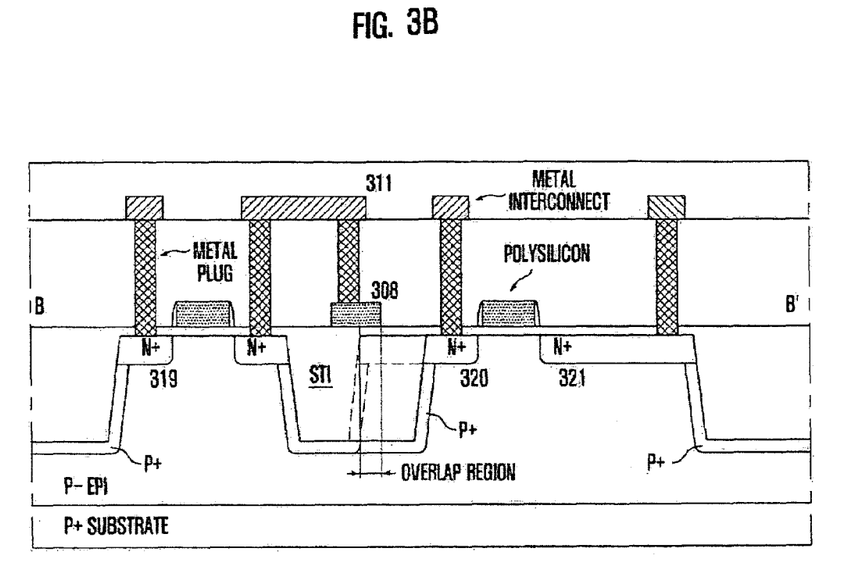
Figure 3C:
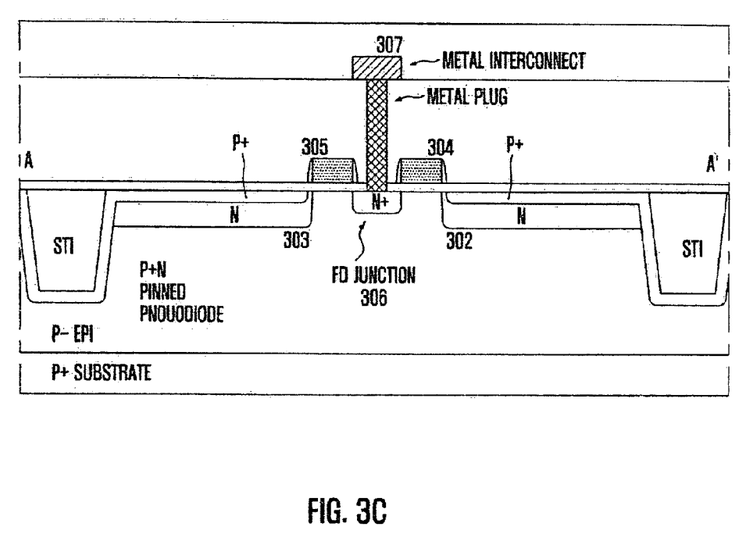

A pixel array 300 represents a similar layout as is shown in the above described pixel array 200 in FIG. 2. The active region is also split into several distinct regions. A first active region 301 contains pinned photodiodes 302 and 303, transfer gates 304 and 305, and a common FD node 306 (see also FIG. 3A). Two other active regions, namely a second active region 309 and a third active region 318, contain a reset transistor with a gate 310 and a drain 319, and a drive transistor Dx with a gate 312, a drain 321 and a source 320 (see also FIG. 3B). In this concept the address select transistor has been eliminated and is replaced by an external circuit that pulses a powering line 322 as described by Kasano. A first bus 307 connects the common FD node 306 to a poly-silicon bus 308 (see also FIG. 3C). A second bus 311 connects the poly-silicon bus 308 to a source of the reset transistor. The gate 310 of the reset transistor receives the reset pulses of the gate 310 via contact 313 from a reset line 323. The pixel is addressed by the powering line 322, which is connected to the drain 321 of the drive transistor and thus turns the drive transistor on. The output signal is detected at the source 320 of the drive transistor, which is connected to a column bus line 316. Another column bus line 317 supplies bias to the drain 319 of the reset transistor. It is also possible to extend the third active region 318 similarly as in the previous embodiment such that the third active region 318 overlaps the poly-silicon bus 308 and forms a capacitor. This extended capacitor is not shown in this drawing to maintain clarity and simplicity. Horizontal bus lines 314 and 315 supply transfer pulses to the transfer gates 304 and 305. The pulses are generated in the peripheral circuits which are not shown in this drawing. The output signal is also processed in the peripheral circuits as is well known to those skilled in the art. These circuits are also not shown in FIG. 3.

An advantage of this embodiment is that there are only two transistors per pixel, and this advantage, makes it possible to design high performance image sensors with very small pixel sizes using only moderate design rules. Both embodiments utilize pinned photodiodes that have p+ Boron impurities implanted at the silicon-silicon dioxide interface in pinned photodiode regions. This implantation causes quenching of the interface states and low dark current generation. Another advantage of the layouts is high aperture efficiency resulting from smaller area occupied by the pixel transistors.

Also, in the above described embodiments, the drive transistor can be fabricated as an N-channel metal-oxide-semiconductor (NMOS) transistor or as a P-channel MOS (PMOS) transistor. In particular, fabricating the drive transistor as a depletion type PMOS transistor contributes to an improvement of noise.

The present patent application contains subject matter related to the Korean patent application No. KR 2005-0051555, filed in the Korean Patent Office on Jun. 15, 2005, the entire contents of which being incorporated herein by reference.

Having described preferred embodiments of novel 3T and 4T pixel layouts that are compact, have high sensitivity, and low dark current, which are intended to be illustrative and not limiting, it is noted that persons skilled in the art can make modifications and variations in light of the above teachings. It is therefore to be understood that changes may be made in the particular embodiments of the invention disclosed, which are within the scope and spirit of the invention as defined by appended claims.

What is claimed is:

1. An image sensor including a plurality of pixels arrayed in rows and columns, comprising:
a first active region including two photodiodes each assigned for a different row and a common floating diffusion node shared by the two photodiodes;
a second active region spatially separated from the first active region and including a reset transistor for resetting the corresponding pixel;
a third active region spatially separated from the first active region and the second active region and including a drive transistor outputting a pixel signal in response to a voltage on the floating diffusion node; and
a polysilicon bus connected with the common floating diffusion node and a source of the reset transistor.

2. The image sensor of claim 1, wherein the third active region further includes a select transistor for row addressing.

3. The image sensor of claim 1, wherein the drive transistor at one selected row of the pixel array includes a drain region being a part of the third active region and to which a pulse is supplied for row addressing.

4. The image sensor of claim 1, wherein the drive transistor includes a source region being a part of the third active region and being connected to a pixel output signal line.

5. The image sensor of claim 2, wherein the source region of the drive transistor and a drain region of the select transistor are formed within a common region of the third active region.

6. The image sensor of claim 2, wherein a source region of the select transistor being a part of the third active region is connected to a pixel output signal line.

7. The image sensor of claim 4, wherein a gate of the drive transistor is electrically connected with the common floating diffusion node.

8. The image sensor of claim 6, wherein a gate of the drive transistor is electrically connected with the common floating diffusion node.

9. The image sensor of claim 7, wherein the reset transistor includes a source region being a part of the second active region and being electrically connected with the gate of the drive transistor.

10. The image sensor of claim 8, wherein the reset transistor includes a source region being a part of the second active region and being electrically connected with the gate of the drive transistor.

11. The image sensor of claim 9, wherein the drain region of the drive transistor and a drain region of the reset transistor are respectively connected with a column bus line.

12. The image sensor of claim 10, wherein the drain region of the drive transistor and a drain region of the reset transistor being another part of the second active region make individual connection with a VDD powering line.

13. The image sensor of claim 1, wherein the photodiodes are pinned photodiodes.

14. The image sensor of claim 1, wherein the drive transistor is one of an N-channel metal-oxide semiconductor (MOS) transistor and a depletion type P-channel MOS transistor.

15. An image sensor including a plurality of pixels arrayed in rows and columns, comprising:
a first active region including two photodiodes each assigned for a different row and a common floating diffusion node shared by the two photodiodes;
second active region spatially separated from the first active region and including a drive transistor outputting a pixel signal in response to a voltage from the floating diffusion node;
a poly-silicon bus extended from a gate of the drive transistor; and
a capacitor formed as the poly-silicon bus overlaps with a drain region of the drive transistor being a part of the second active region to electrically connect the gate of the drive transistor with the at last one of the drain region and the source of the drive transistor.

16. The image sensor of claim 15, further including a third active region spatially separated from the first active region and the second active region and provided with a reset transistor for resetting the corresponding pixel.

17. The image sensor of claim 16, wherein the second active region further includes a select transistor for a row addressing.

18. The image sensor of claim 16, wherein the drain region of the drive transistor at one selected row of the pixel array is supplied with a pulse for a row addressing.

19. The image sensor of claim 16, wherein the drive transistor includes a source region being another part of the second active, region and being connected to a pixel output signal line.

20. The image sensor of claim 17, wherein the source region of the drive transistor and a drain region of the select transistor are formed within a common region of the second active region.

21. The image sensor of claim 17, wherein the select transistor includes a source region being a part of the second active region and being connected to a pixel output signal line.

22. The image sensor of claim 19, the poly-silicon bus is electrically connected with the common floating diffusion node and with a source region of the reset transistor being a part of the third active region.

23. The image sensor of claim 21, the poly-silicon bus is electrically connected with the common floating diffusion node and with a source region of the reset transistor being a part of the third active region.

24. The image sensor of claim 22, wherein the poly-silicon bus is connected with the common floating diffusion node through a first metal interconnect and with the source region of the reset transistor through a second metal interconnect.

25. The image sensor of claim 23, wherein the poly-silicon bus is connected with the common floating diffusion node through a first metal interconnect and with the source region of the reset transistor through a second metal interconnect.

26. The image sensor of claim 22, wherein the drain region of the drive transistor and a drain region of the reset transistor are respectively connected with a column bus line.

27. The image sensor of claim 23, wherein the drain region of the drive transistor and a drain region of the reset transistor are respectively connected with a column bus line.

28. The image sensor of claim 15, wherein the photodiodes are pinned photodiodes.

29. The image sensor of claim 15, wherein the drive transistor is one of an N-channel metal-oxide semiconductor (MOS) transistor and a depletion type P-channel MOS transistor.

* * * * *